United States Patent
Chen et al.

(10) Patent No.: US 10,923,601 B2
(45) Date of Patent: Feb. 16, 2021

(54) CHARGE TRAPPING SPLIT GATE DEVICE AND METHOD OF FABRICATING SAME

(71) Applicant: Cypress Semiconductor Corporation, San Jose, CA (US)

(72) Inventors: Chun Chen, San Jose, CA (US); Shenqing Fang, Sunnyvale, CA (US); Unsoon Kim, San Jose, CA (US); Mark T. Ramsbey, Sunnyvale, CA (US); Kuo Tung Chang, Saratoga, CA (US); Sameer S. Haddad, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/949,328

(22) Filed: Apr. 10, 2018

(65) Prior Publication Data

US 2018/0323314 A1 Nov. 8, 2018

Related U.S. Application Data

(63) Continuation of application No. 13/715,185, filed on Dec. 14, 2012, now Pat. No. 9,966,477.

(51) Int. Cl.
| | |
|---|---|
| *H01L 27/105* | (2006.01) |
| *H01L 27/108* | (2006.01) |
| *H01L 29/792* | (2006.01) |
| *H01L 27/11573* | (2017.01) |
| *H01L 29/423* | (2006.01) |
| *H01L 29/66* | (2006.01) |

(52) U.S. Cl.
CPC ...... *H01L 29/792* (2013.01); *H01L 27/11573* (2013.01); *H01L 29/42344* (2013.01); *H01L 29/66833* (2013.01)

(58) Field of Classification Search
None
See application file for complete search history.

(56) References Cited

U.S. PATENT DOCUMENTS

| | | |
|---|---|---|
| 5,824,584 A | 10/1998 | Chen et al. |
| 5,969,383 A | 10/1999 | Chang et al. |

(Continued)

FOREIGN PATENT DOCUMENTS

| | | |
|---|---|---|
| JP | 2003243619 A | 8/2003 |
| JP | 2003309193 A | 10/2003 |

(Continued)

OTHER PUBLICATIONS

International Search Report for International Application No. PCT/US2013/074724 dated Apr. 24, 2014; 2 pages.

(Continued)

*Primary Examiner* — Joseph C. Nicely
*Assistant Examiner* — Lamont B Koo

(57) ABSTRACT

A split gate device that includes a memory gate and a select gate disposed side by side, a dielectric structure having a first portion disposed between the memory gate and a substrate and a second portion disposed along an inner sidewall of the select gate to separate the select gate from the memory gate, and a spacer formed over the select gate along an inner sidewall of the memory gate. Other embodiments of embedded split gate devices including high voltage and low voltage transistors are also disclosed.

20 Claims, 14 Drawing Sheets

(56) References Cited

U.S. PATENT DOCUMENTS

| | | | |
|---|---|---|---|
| 6,972,997 | B2 | 12/2005 | Ishimaru et al. |
| 7,057,230 | B2 | 6/2006 | Tanaka et al. |
| 7,115,943 | B2 | 10/2006 | Mine et al. |
| 7,371,631 | B2 | 5/2008 | Sakai et al. |
| 7,414,283 | B2 | 8/2008 | Tanaka et al. |
| 7,504,689 | B2 | 3/2009 | Hisamoto et al. |
| 7,557,005 | B2 | 7/2009 | Ishii et al. |
| 7,663,176 | B2 | 2/2010 | Sakai et al. |
| 7,667,259 | B2 | 2/2010 | Yasui et al. |
| 7,700,992 | B2 | 4/2010 | Tanaka et al. |
| 7,723,779 | B2 | 5/2010 | Hisamoto et al. |
| 7,863,135 | B2 | 1/2011 | Sakai et al. |
| 7,863,670 | B2 | 1/2011 | Ishii et al. |
| 8,017,986 | B2 | 9/2011 | Tanaka et al. |
| 8,125,012 | B2 | 2/2012 | Mine et al. |
| 8,193,052 | B2 | 6/2012 | Park |
| 9,443,991 | B2 | 9/2016 | Funayama et al. |
| 2001/0004120 | A1* | 6/2001 | Colclaser .............. H01L 27/105 257/326 |
| 2003/0211691 | A1 | 11/2003 | Ueda |
| 2005/0176202 | A1 | 8/2005 | Hisamoto et al. |
| 2006/0008992 | A1 | 1/2006 | Shukuri |
| 2006/0275975 | A1 | 12/2006 | Yeh et al. |
| 2007/0145455 | A1 | 6/2007 | Yasui et al. |
| 2007/0218633 | A1 | 9/2007 | Prinz et al. |
| 2008/0203466 | A1 | 8/2008 | Sakai et al. |
| 2009/0085090 | A1 | 4/2009 | Nagai |
| 2009/0108325 | A1 | 4/2009 | Kang et al. |
| 2010/0105199 | A1 | 4/2010 | Yasui et al. |
| 2010/0301404 | A1* | 12/2010 | Kawashima ...... H01L 29/66833 257/316 |
| 2011/0095348 | A1* | 4/2011 | Chakihara ......... H01L 21/28273 257/298 |
| 2011/0108906 | A1 | 5/2011 | Yaegashi et al. |
| 2011/0198681 | A1 | 8/2011 | Shukuri |
| 2011/0211396 | A1 | 9/2011 | Takeuchi |
| 2011/0272753 | A1* | 11/2011 | Funayama ........ H01L 27/11565 257/299 |

FOREIGN PATENT DOCUMENTS

| | | |
|---|---|---|
| JP | 2004186452 A | 7/2004 |
| JP | 2006019373 A | 1/2006 |
| JP | 2010067645 A | 3/2010 |
| JP | 2012069652 A | 4/2012 |
| JP | 2012114269 A | 6/2012 |
| KR | 1020100080226 A | 7/2010 |
| WO | 2004084314 A1 | 9/2004 |

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

JPO Office Action for Application No. 2015-547553 dated Apr. 8, 2018, 6 pages.

JPO Office Action for Application No. 2015-547553 dated Oct. 13, 2017, 6 pages.

Matsubara, K. et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Labratories, NEC Corporation, 2008.

USPTO Advisory Action for U.S. Appl. No. 13/715,185 dated Apr. 13, 2016; 4 pages.

USPTO Advisory Action for U.S. Appl. No. 13/715,185 dated Oct. 27, 2017; 3 pages.

USPTO Advisory Action for U.S. Appl. No. 13/715,185 dated Nov. 10, 2015; 4 pages.

USPTO Advisory Action for U.S. Appl. No. 13/715,185 dated Jan. 24, 2017; 4 pages.

USPTO Applicant Initiated Interview Summary for U.S. Appl. No. 13/715,185 dated Mar. 8, 2016; 3 pages.

USPTO Final Rejction for U.S. Appl. No. 13/715,185 dated Nov. 23, 2016; 20 pages.

USPTO Final Rejection for U.S. Appl. No. 13/175,185 dated Sep. 15, 2015; 18 pages.

USPTO Final Rejection for U.S. Appl. No. 13/715,185 dated Feb. 23, 2015; 16 pages.

USPTO Final Rejection for U.S. Appl. No. 13/715,185 dated Mar. 17, 2016; 18 pages.

USPTO Final Rejection for U.S. Appl. No. 13/715,185 dated Aug. 17, 2017; 22 pages.

USPTO Non-Final Rejection for U.S. Appl. No. 13/715,185 dated Jan. 5, 2016; 17 pages.

USPTO Non-Final Rejection for U.S. Appl. No. 13/715,185 dated Mar. 20, 2017; 21 pages.

USPTO Non-Final Rejection for U.S. Appl. No. 13/715,185 dated May 6, 2015; 16 pages.

USPTO Non-Final Rejection for U.S. Appl. No. 13/715,185 dated Sep. 23, 2014; 16 pages.

USPTO Non-Final Rejection for U.S. Appl. No. 13/715,185 dated Jun. 28, 2016; 19 pages.

USPTO Notice of Allowance for U.S. Appl. No. 13/715,185 dated Jan. 8, 2018; 11 pages.

Written Opinion of the International Searching Authority for International Application No. PCT/US2013/074724 dated Apr. 24, 2014; 8 pages.

Yanagi, I., et al., "Quantum confinement effect of efficient hole injection in MONOS-type nonvolatile memory—the role of ultrathin i-Si/P+ poly-Si stacked gate structure fabricated by laser spike annealing," 146-147, Symposium on VLSI Technology, Digest of Technical Papers, Central Research Laboratory, Hitachi Ltd., 2007.

German Exam Report for Application No. 11 2013 005 974.6 dated May 20, 2019; 14 pages.

German Exam Report for German Patent Application No. 11 2013 005 974.6 dated Dec. 17, 2019; 8 pages.

Japanese Office Action for Japanese Patent Application No. 2018-235247 dated Jan. 16, 2020, 7 pages.

German Exam Report for Application No. 11 2013 005 974.6 dated Oct. 22, 2019; 10 pages.

Japanese Office Action for Japanese Patent Application No. 2018-235247 dated Oct. 19, 2020, 7 pages.

\* cited by examiner

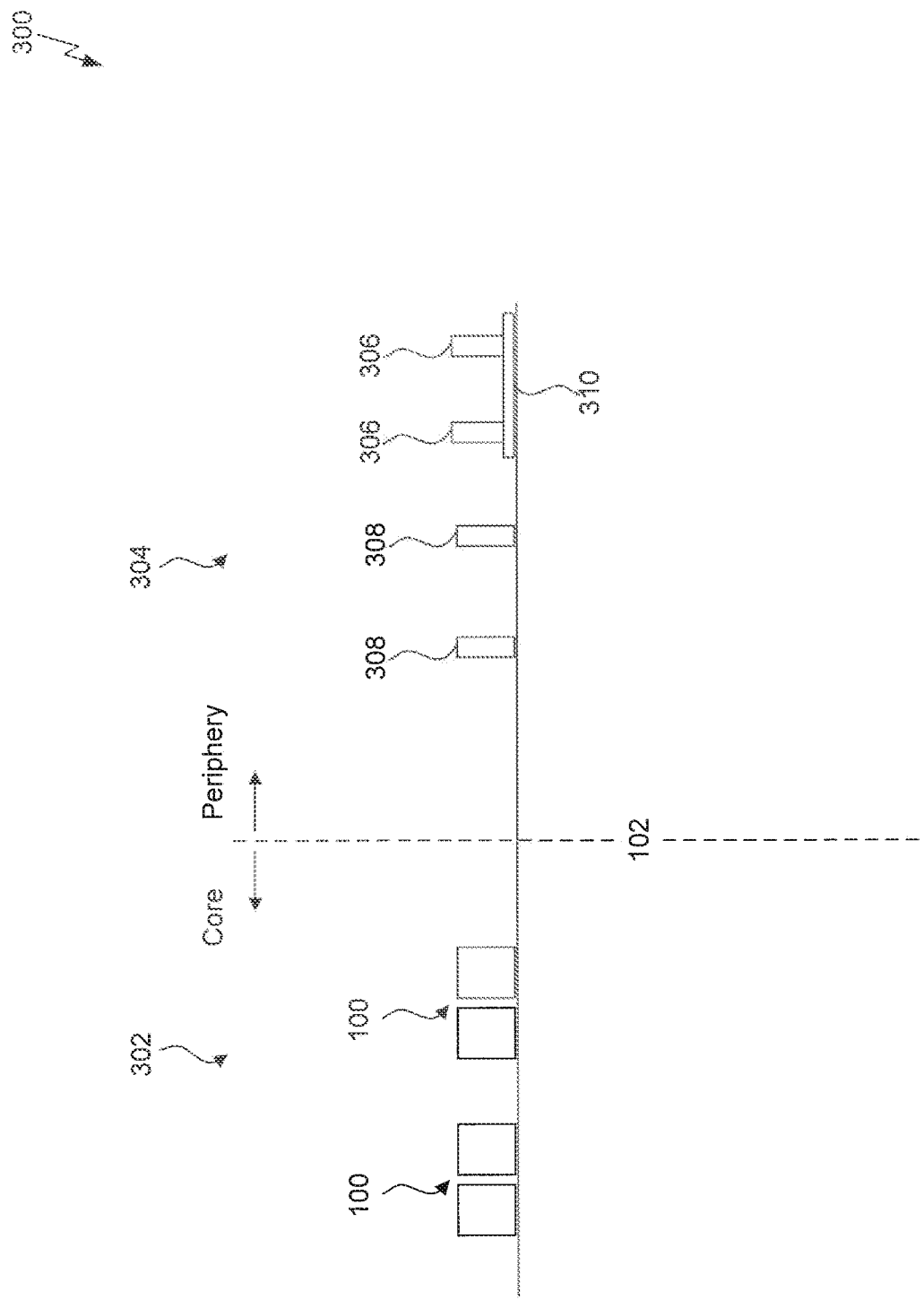

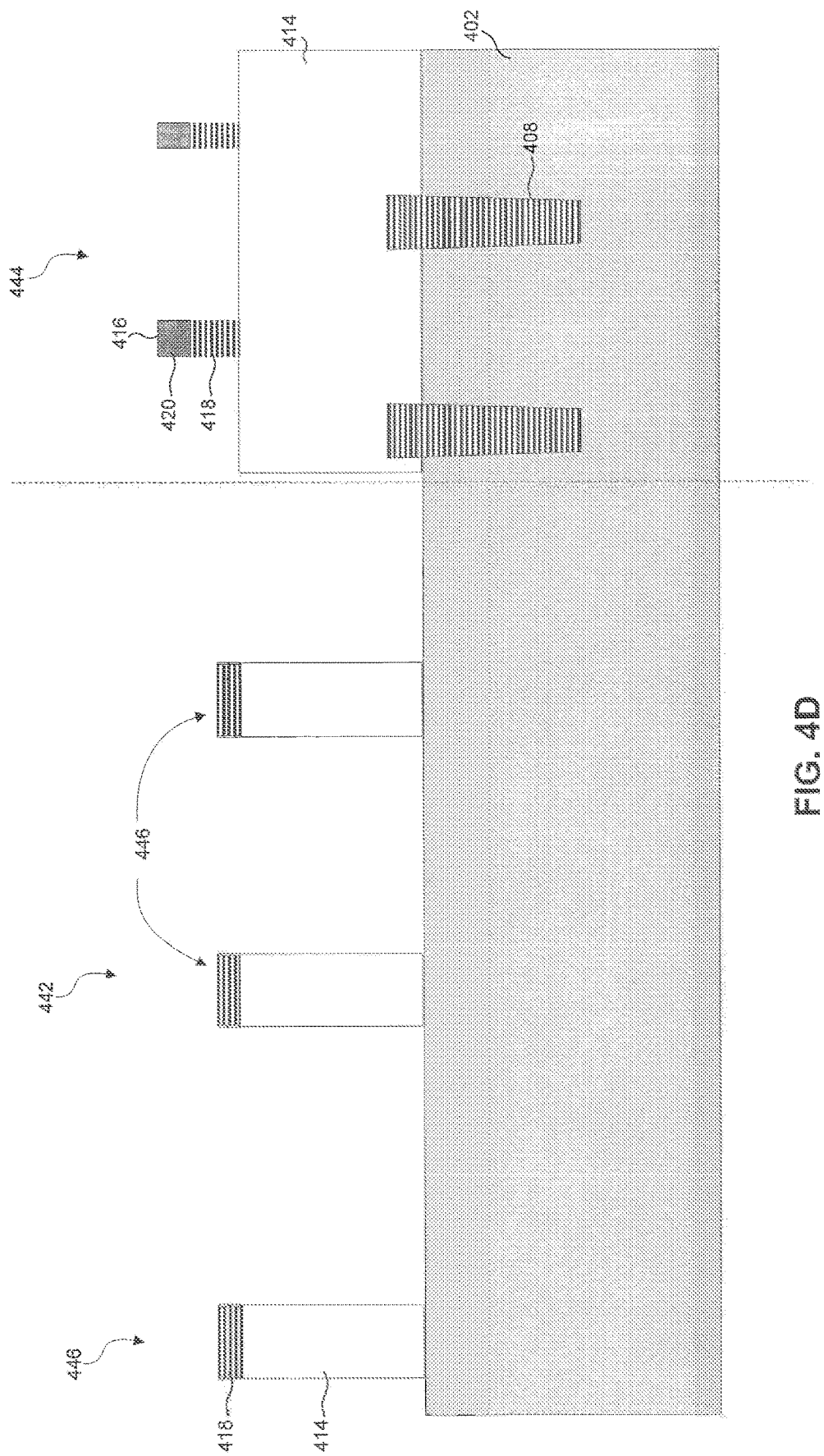

CHARGE TRAPPING SPLIT GATE DEVICE AND METHOD OF FABRICATING SAME

CROSS REFERENCE TO RELATED APPLICATION

This application is a continuation of U.S. patent application Ser. No. 13/715,185, filed Dec. 14, 2012, which is incorporated by reference herein in its entirety.

FIELD OF THE INVENTION

The present disclosure relates generally to nonvolatile memory.

BACKGROUND ART

There is a growing demand to provide advanced logic components (e.g., microcontrollers) with support memory, commonly implemented using non-volatile memory (e.g., Flash). Generally, two approaches exist for providing the support memory. One approach includes fabricating the advanced logic components and the memory components on separate semiconductor chips and interfacing the separate chips via a communication interface, resulting in a non-monolithic design. Another approach includes integrating the advanced logic and the memory components on the same semiconductor chip, in what is known as an embedded memory design.

Generally, an embedded memory design is favored over a non-monolithic design for speed, security, and power consumption considerations, but requires an integration process for fabricating the advanced logic components and the memory components on the same semiconductor chip.

BRIEF SUMMARY

Embodiments provide a split gate device, methods for fabricating a split gate device, and integrated methods for fabricating a split gate device and a periphery device. In an embodiment, the split gate device is a charge trapping split gate device, which includes a charge trapping layer. In another embodiment, the split gate device is a non-volatile memory cell, which can be formed according to embodiments as standalone or embedded with a periphery device.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

FIG. 3 illustrates an example semiconductor device that includes both memory and peripheral circuitry embedded in the same substrate.

FIGS. 4A-J are cross sectional views illustrating various example steps in a method of fabricating a split gate device according to an embodiment.

Figure 5:
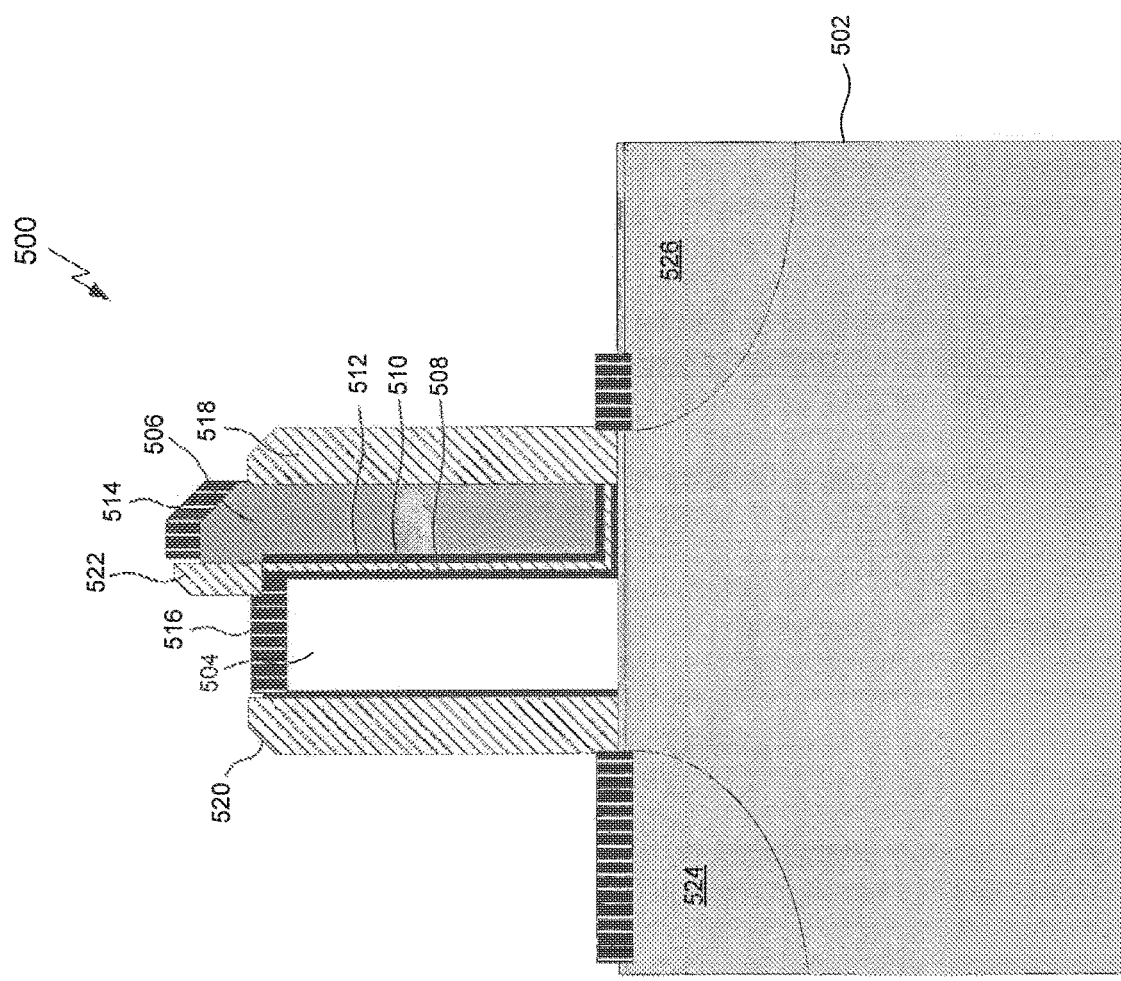

FIG. 5 is a cross sectional view of an example split gate device according to an embodiment.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
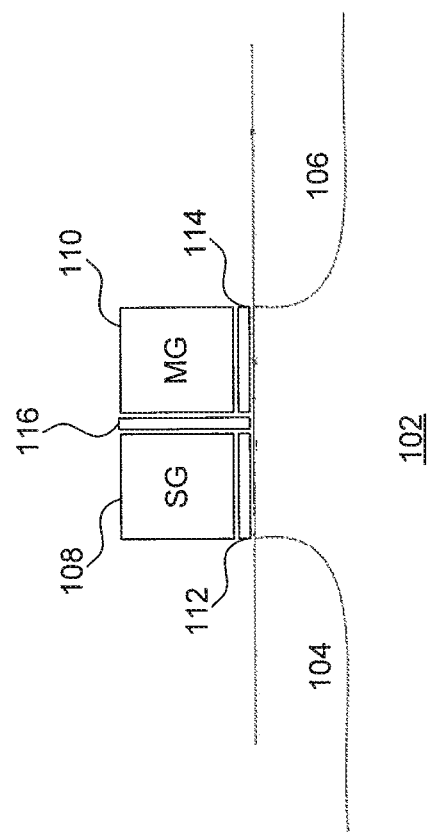
FIG. 1 illustrates an example split-gate non-volatile memory cell.

FIG. 1 illustrates an example split-gate non-volatile memory cell 100 according to an embodiment. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped polycrystalline silicon (poly) layer formed by well known, for example, deposit and etch techniques to define the gate structure. Select gate 108 is disposed over a dielectric layer 112. Memory gate 110 is disposed over a charge trapping dielectric 114 consisting of one or more dielectric layers. In one example, charge trapping dielectric 114 includes a silicon nitride layer sandwiched between two silicon dioxide layers to create a three-layer stack collectively and commonly referred to as "ONO." Other charge trapping dielectric may include a silicon-rich nitride film, or any film that includes, but not limited to, silicon, oxygen, and nitrogen in various stoichiometries.

A vertical dielectric 116 is also disposed between select gate 108 and memory gate 110 for electrical isolation between the two gates. In some examples, vertical dielectric 116 and charge trapping dielectric 114 are the same dielectric, while in other examples one dielectric is formed before the other (i.e., they can have different dielectric properties). As such, vertical dielectric 116 need not include the same film structure as charge trapping dielectric 114.

Regions 104 and 106 are created by implanting dopants using, for example, an ion implantation technique. Regions 104 and 106 form the source or drain of a split-gate transistor depending on the voltages applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of the electrons will acquire sufficient energy to be injected upwards and get trapped inside the charge trapping dielectric 114. This is known as hot electron injection. In one example of charge trapping dielectric 114, the electrons are trapped within the nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or placed at certain bias, and select gate 108 and substrate 102 are typically grounded. A high negative voltage on the order of −8 volts, for example, is applied to memory gate 110. The bias conditions between memory gate 110 and region 106 generate holes through band to band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage in the range between zero and 3 volts, for example, is applied to each of select gate 108, memory gate 110, and region 104, while region 106 and substrate 102 are typically grounded. The low voltage applied to memory gate 110 is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation causes substantial current to flow between regions 104 and 106, then memory cell 100 holds a "low" bit and if the application of the low voltage during the "read" operation does not cause substantial current to flow between regions 104 and 106, then memory cell 100 holds a "high" bit.

Figure 2:
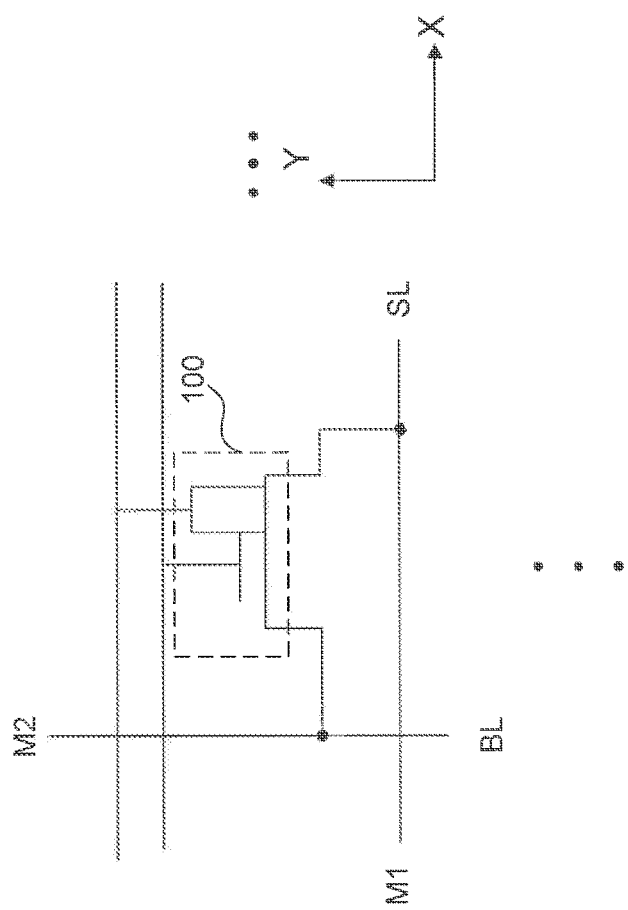
FIG. 2 illustrates an example circuit diagram of the memory cell illustrated in FIG. 1.

FIG. 2 illustrates an example circuit diagram 200 of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). The source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

There is commonly a need to provide advanced logic components (e.g., microcontrollers) with support memory components, typically implemented using memory cells, such as memory cells 100. Generally, two approaches exist for providing the memory components. One approach includes fabricating the advanced logic components and the memory components on separate semiconductor chips and interfacing the separate chips via a communication interface, resulting in a non-monolithic design. Another approach includes integrating the advanced logic and the memory components on the same semiconductor chip, in what is known as an embedded memory design. Generally, an embedded memory design is favored over a non-monolithic design for speed and power consumption considerations, but requires an integration process for fabricating the advanced logic components and the memory components on the same semiconductor chip.

FIG. 3 illustrates an example semiconductor device 300 that includes memory and peripheral circuitry embedded in the same substrate. The peripheral circuitry may include advanced logic components as described above. Device 300 is commonly known as a system-on-chip (SOC). In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. High-voltage transistors 306 are capable of handling voltages up to 20 volts, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

An existing process for integrating a split gate device (e.g., memory cell 100) with a periphery device (e.g., transistor 306 or 308) includes forming simultaneously the select gate (e.g., select gate 108) of the split gate device in a core region of a substrate (e.g., core region 302) and the gate of the periphery device in a periphery region (e.g., periphery region 304) of the substrate; forming a bottom oxide layer, a charge trapping layer, and a blocking dielectric layer over both the core region and the periphery region; forming the memory gate (e.g., memory gate 110) of the split gate device; and then stripping the blocking dielectric layer and the charge trapping layer in the periphery region of the substrate.

Because the gate of the periphery device is formed at the same time as the select gate of the split gate device, the periphery device gate is exposed to the deposition/growth process steps of the bottom oxide layer, the charge trapping layer, and the blocking dielectric layer as well as to the subsequent removal steps of the blocking dielectric layer and the charge trapping layer. This exposure typically causes narrowing (the length) of the periphery device gate, resulting in significant performance degradation of the resulting periphery device (particularly for short gate devices) as well as undesired process variations across devices.

Embodiments as further described below provide methods for fabricating a split gate device as well as an integrated method for fabricating a split gate device and a periphery device. In an embodiment, the split gate device is a charge trapping split gate device. Embodiments do not suffer from the above described problems of the existing integration process. FIGS. 4A-J are cross sectional views illustrating various exemplary steps of a fabrication method according to an embodiment.

Figure 4A:
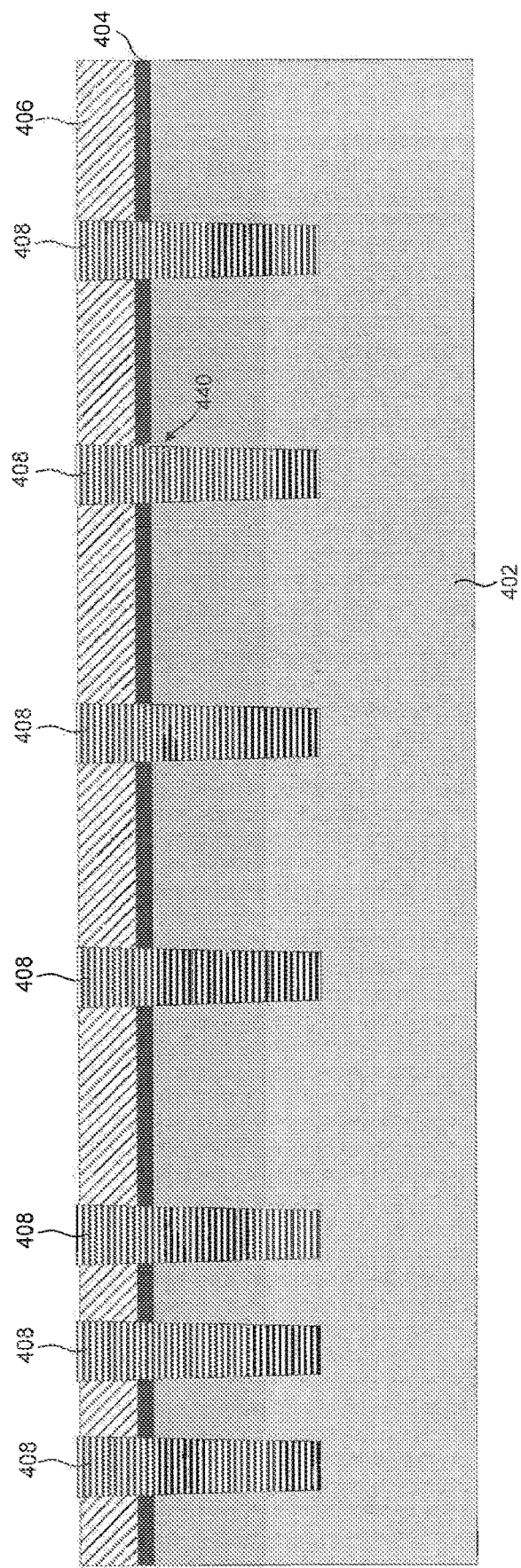

A description of the fabrication method begins with reference to FIG. 4A, which shows a substrate 402 (e.g., silicon substrate) having device isolation trench (e.g., shallow trench isolation (STI)) formations 408 created in substrate 402, a pad oxide layer 404 disposed over substrate 402, and a silicon nitride layer 406 disposed over pad oxide layer 406.

Commonly, the cross section illustrated in FIG. 4A is obtained by first disposing a pad oxide layer 404 over substrate layer 402, followed by silicon nitride layer 406. Pad oxide layer 404, silicon nitride layer 406, and substrate 402 are then patterned and etched to form trenches, which are then filled with an oxide (e.g., STI oxide) to form trench formations 408. Subsequently, in steps not shown in FIG. 4A, silicon nitride layer 406 and pad oxide layer 404 are removed (e.g. wet etched), and a gate oxide layer (thin and/or thick) is grown from substrate 402.

In some cases, the removal step of pad oxide layer 404 also causes degradation of the trench formations 408 (which typically are oxide also) at the regions illustrated by the numeral 440 in FIG. 4A. As a result, when the gate oxide layer is subsequently grown from substrate 402, the gate oxide layer will be thinner near the regions 440 than in other regions of the substrate. This variation in gate oxide thickness is particularly problematic when a thick gate oxide is grown from substrate 402, and can result in the gate of a subsequently formed device to break down at regions 440 under high voltage conditions.

In an embodiment, to remedy this problem, trench formations 408 are formed after the gate oxide layer (thin and/or thick) is grown from substrate 402. As such, in this embodiment, a thick gate oxide layer (and optionally a thin gate oxide layer) is grown from a respective region of substrate 402 before silicon nitride layer 406 is disposed over substrate 404. Silicon nitride layer 406, the gate oxide layer (where grown), and substrate 402 are then patterned and etched to form trenches, which are then filled with an oxide (e.g., STI oxide) to form trench formations 408. Silicon nitride layer 406 is then removed.

Figure 4B:
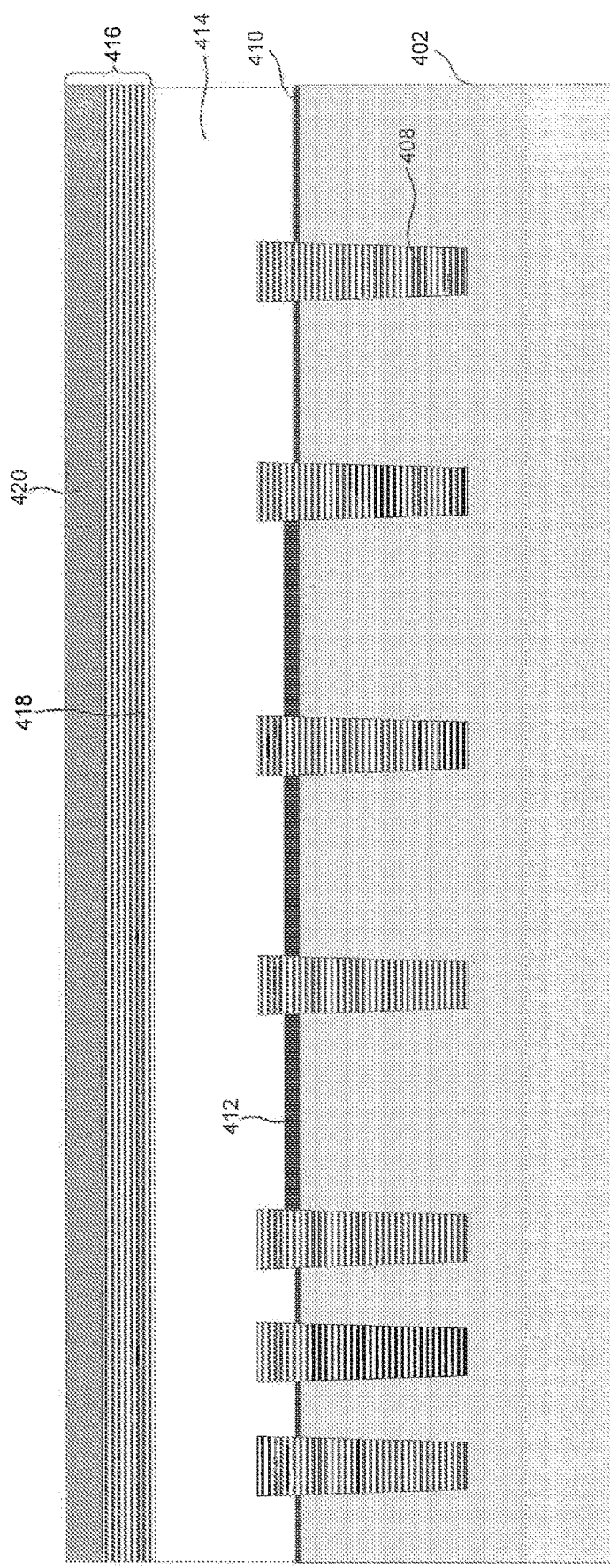

Referring now to FIG. 4B, a thin gate oxide layer 410 and a thick oxide layer 412 are disposed over respective regions of substrate 402. As described above, in an embodiment, thin gate oxide layer 410 and thick gate oxide layer 412 are created before forming trench formations 408. In an embodiment, to create thin gate oxide layer 410 and thick gate oxide layer 412, a gate oxide layer having a thickness appropriate for desired high voltage applications is first grown from substrate 402, then the gate oxide layer is etched to form thin gate oxide layer 410 and thick gate oxide layer 412 where desired over substrate 402.

Subsequently, a first conductor (e.g., poly) layer 414 is disposed (e.g., deposited) over substrate 402, and a hardmask layer 416 is disposed (e.g., deposited) over first conductor layer 414. In an embodiment, hardmask layer 416 includes a first layer 418 and a second layer 420. First layer 418 and second layer 420 can be any combination of oxide, nitride, or silicon, for example.

Figure 4C:
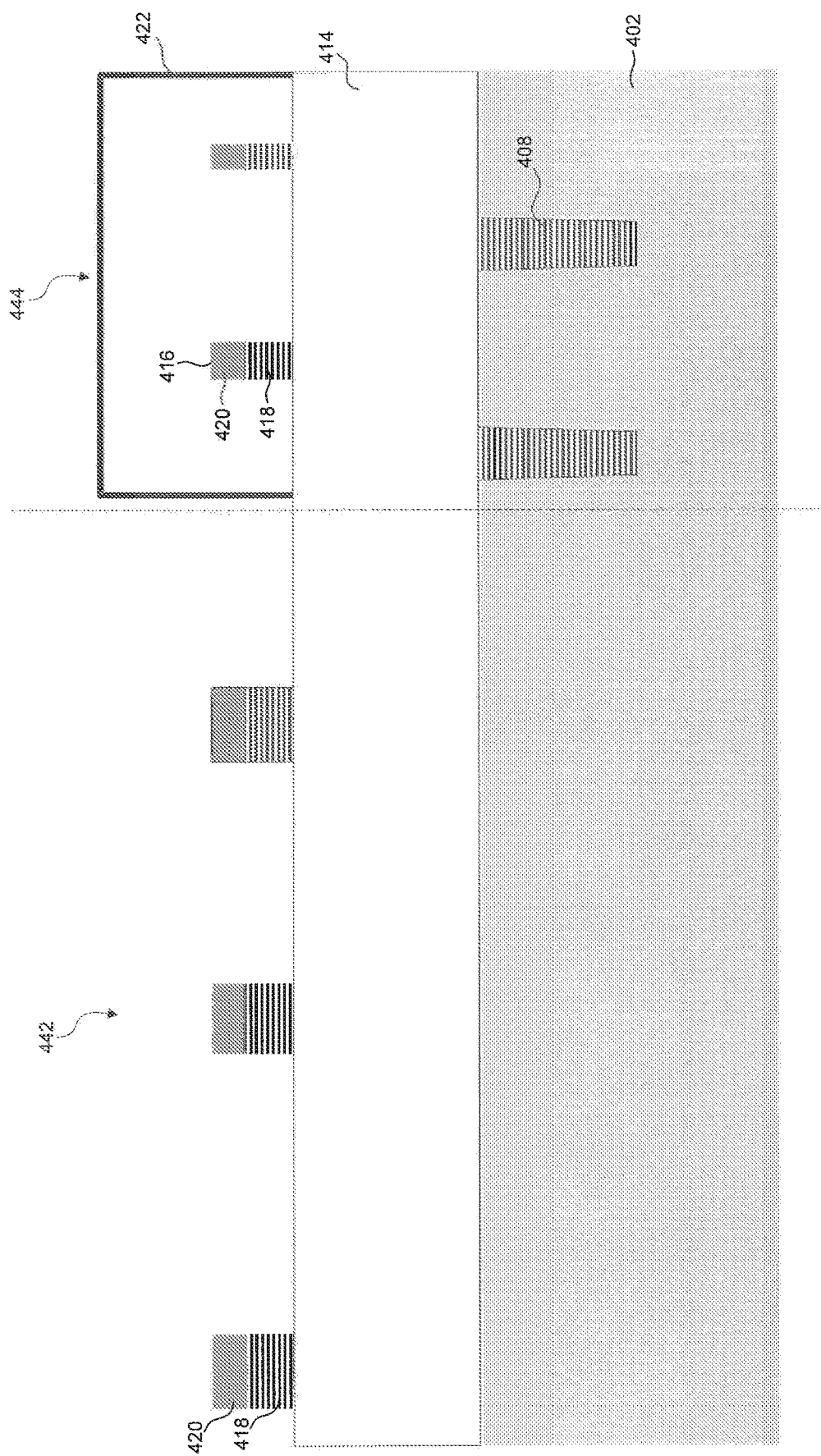

Subsequently, as illustrated in FIG. 4C, a photo resist mask (not shown in FIG. 4C) is selectively created (e.g., using standard lithography steps) over a first region 442 and a second region 444 of substrate 402. In an embodiment, first region 442 corresponds to a core region (e.g., core region 302) where split gate devices are ultimately formed, and second region 444 corresponds to a periphery region (e.g., periphery region 304) where periphery devices are ultimately formed. For simplification purposes, trench formations 408 are not shown in first region 442 in FIG. 4C.

Hardmask layer 416 (only) is then etched (e.g., dry etched) according to the photo resist mask to form a first hardmask gate pattern over first region 442 and a second hardmask gate pattern over second region 444 of substrate 402. The photo resist mask is then stripped and a wet clean is performed, before another photo resist mask 422 is created to cover second region 444 (or a portion thereof) as shown in FIG. 4C.

Then, as illustrated in FIG. 4D, first conductor layer 414 is etched (e.g., dry etched) according to the first hardmask gate pattern over first region 442 to form one or more first gates 446 of split gate devices. In an embodiment, the first gates 446 correspond to select gates of the split gate devices. It is noted that no photo resist mask over first region 442 is needed to perform the etching of first conductor layer 414 because the first hardmask gate pattern provides a mask equivalent in this case. As a result, however, some of hardmask layer 416 is eroded in first region 442. For example, as shown in FIG. 4D, second layer 420 of hardmask layer 416 may be completely eliminated and only some of first layer 418 of hardmask layer 416 may remain after the etching of first conductor layer 414 over first gates 446. In contrast, because second region 444 is protected by photo resist mask 422 as shown in FIG. 4C, hardmask layer 416 is unaffected in second region 444 by the etching of first conductor layer 414. Photo resist mask 422 is then stripped and a wet clean is performed.

Figure 4E:
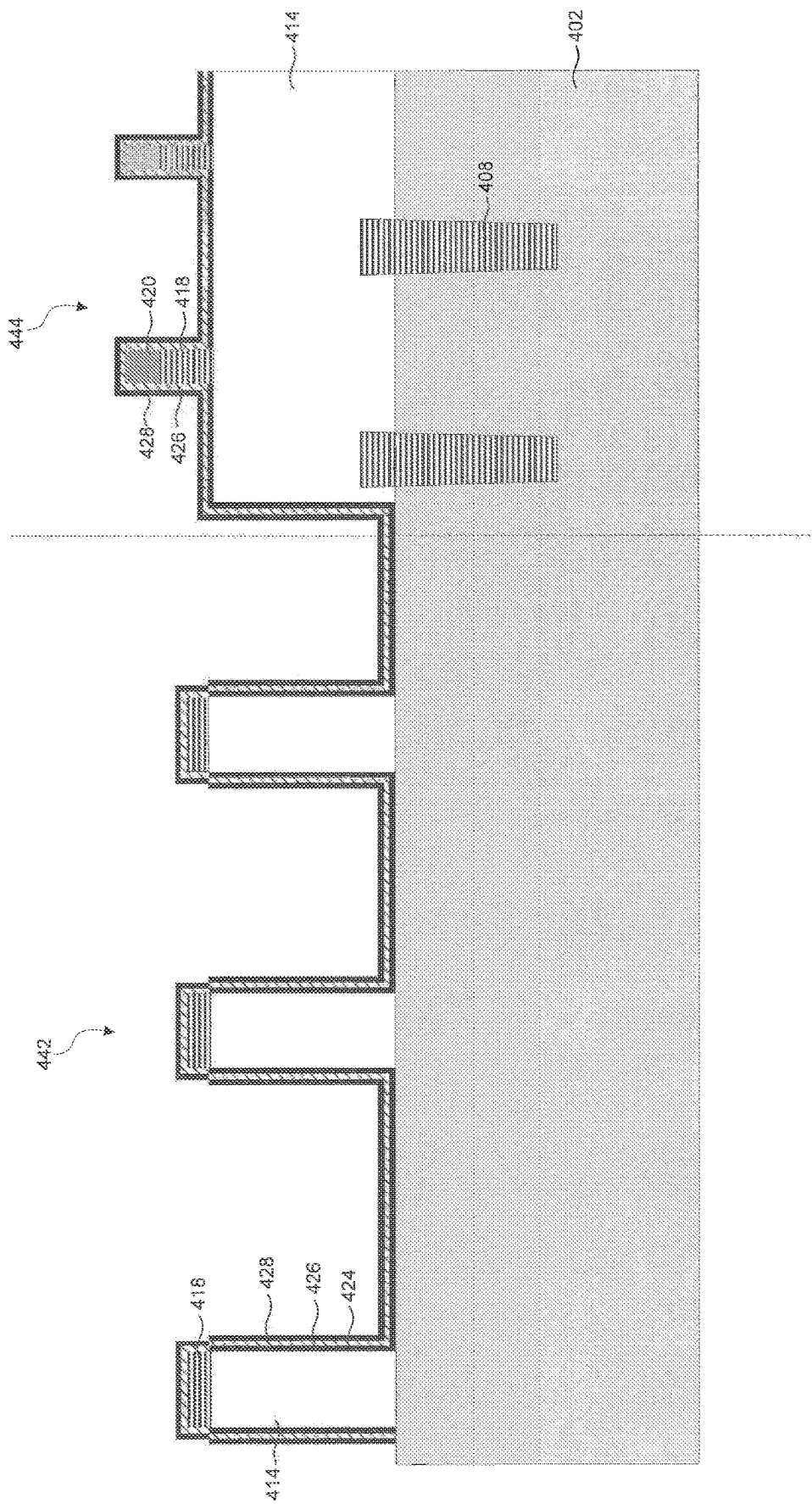

Subsequently, as illustrated in FIG. 4E, a dielectric is formed over the entire substrate 402. Specifically, the dielectric is formed over first gates 446 formed on first region 442 and the second hardmask gate pattern in second region 444. In an embodiment, the dielectric includes one or more dielectric layers. For example, the dielectric may include a silicon nitride layer sandwiched between two silicon dioxide layers to create a three-layer stack collectively and commonly referred to as "ONO." In an embodiment, the silicon nitride layer is used as a charge trapping layer in a charge trapping split gate device. Other charge trapping dielectric may also be used including a silicon-rich nitride film, or any film that includes, but is not limited to, silicon, oxygen, and nitrogen in various stoichiometries.

In an embodiment, as shown in FIG. 4E, the dielectric includes a bottom oxide layer 424, a nitride layer 426, and a top oxide layer 428. To form the dielectric, bottom oxide layer 424 is grown over the entire substrate 402. In an embodiment, as shown in FIG. 4E, bottom oxide layer 424 may grow minimally or may not grow over regions of substrate 402 topped by hardmask material. Then, nitride layer 426 is formed (e.g., deposited) over bottom oxide layer 424, and top oxide layer 428 is formed (e.g., grown or deposited) over nitride layer 426.

Figure 4F:
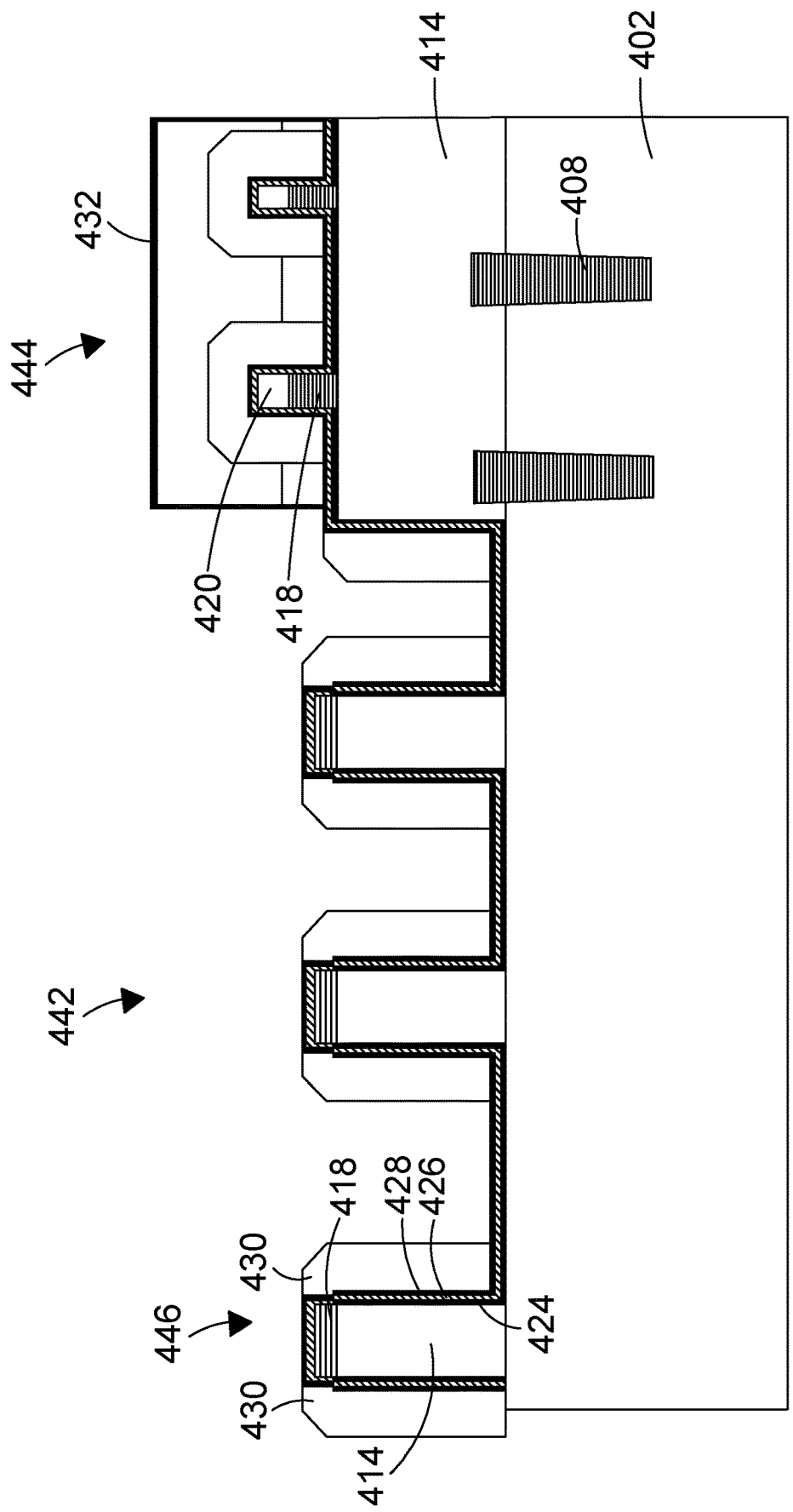

Then, as illustrated in FIG. 4F, a second conductor (e.g., poly) layer is disposed (e.g., deposited) over the dielectric over the entire substrate 402. A photo resist mask 432 is then created to cover second region 444, and the second conductor layer is etched (e.g., anisotropically dry etched) at region 442 as shown in FIG. 4F. In an embodiment, the second conductor layer is etched until top oxide layer 428 of the dielectric is exposed. As such, the etching of the second conductor layer results in first and second formations 430 of the second conductor layer on first and second sidewalls respectively of each first gate 446. Photo resist mask 432 is then stripped and a wet clean is performed.

Figure 4G:
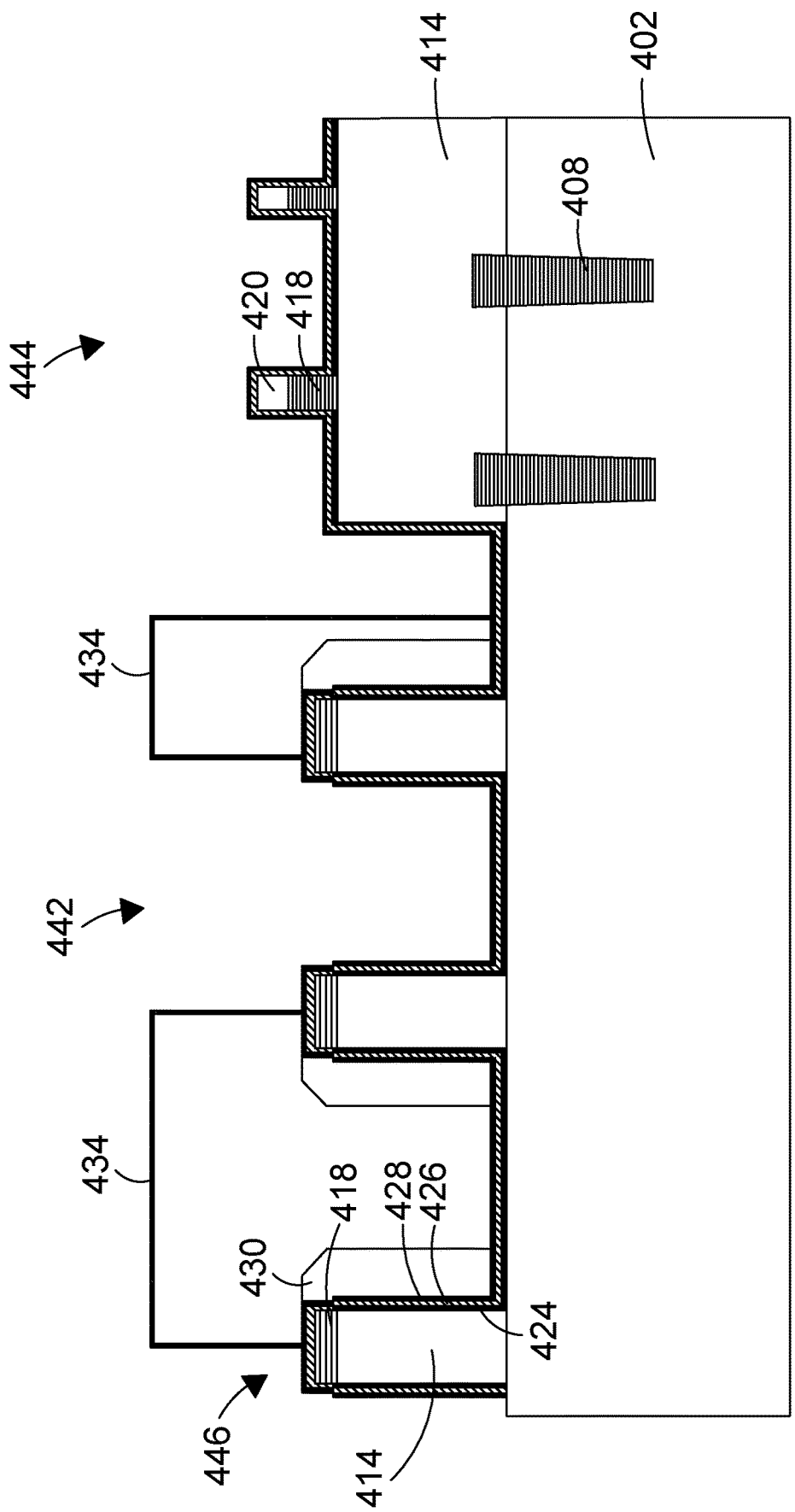

Then, as illustrated in FIG. 4G, a photo resist mask 434 is created such that one or the other of first and second formations 430 around each first gate 446 is covered by photo resist mask 434. The second conductor layer is then etched (e.g., dry etched) over the entire substrate 402. The etching of the second conductor layer removes the non-covered formation 430 of each first gate 446. The remaining formation 430 of each first gate 446 corresponds to a second gate (e.g., memory gate) of the split gate device (hereinafter referred to as second gate 430). The etching of the second conductor layer also removes the second conductor layer from second region 444 to re-expose the dielectric.

Figure 4H:
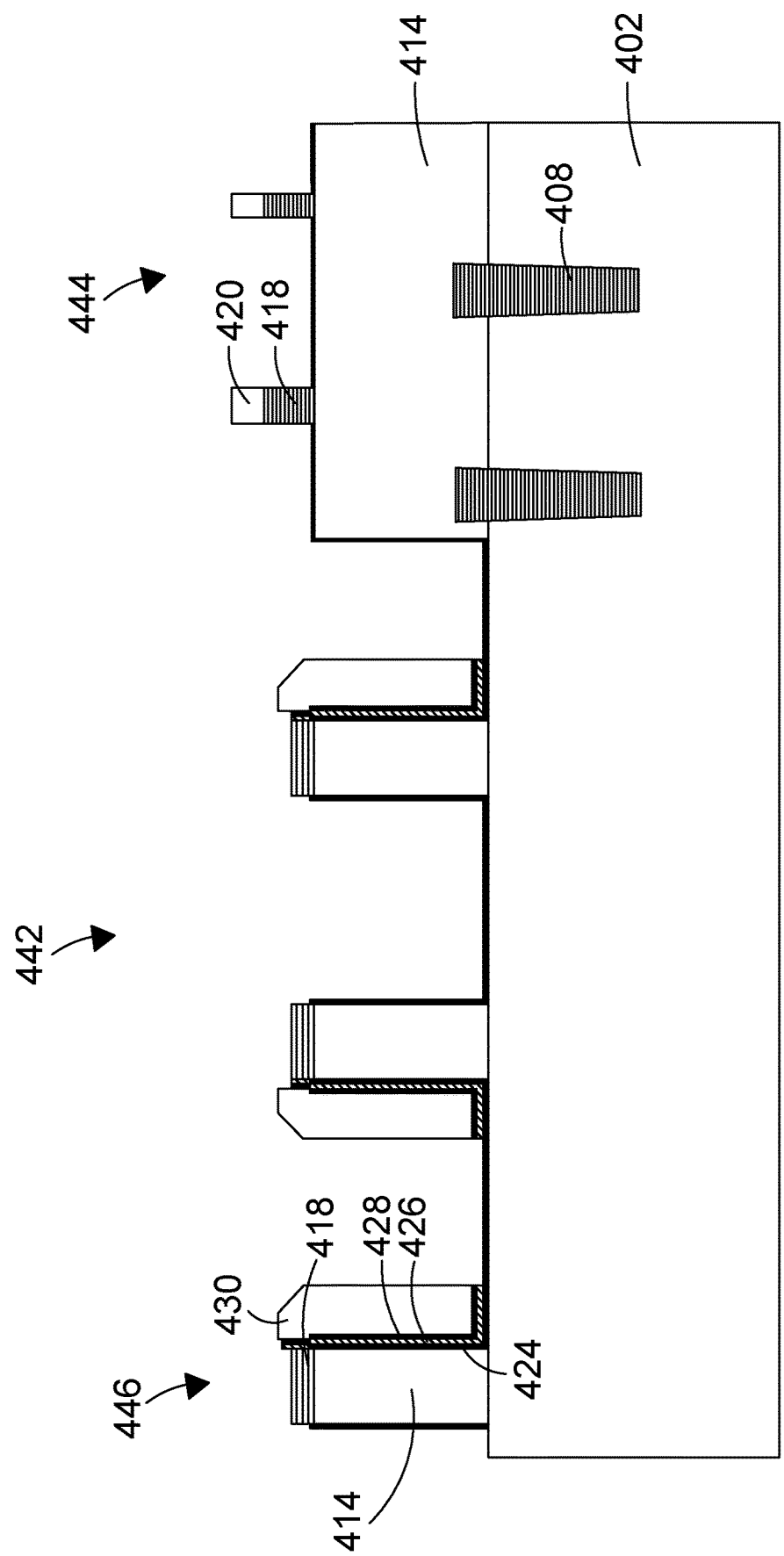

Then, as illustrated in FIG. 4H, photo resist mask 434 is stripped, and top oxide layer 428 and nitride layer 426 are removed (e.g., wet etched) from the top surface over the entire substrate 402. Specifically, top oxide layer 428 and nitride layer 426 are removed over a top surface of each first gate 446 to expose any remaining hardmask layer (e.g., remainder of first layer 418 of the hardmask layer) over the top surface of first gate 446. In another embodiment, no hardmask layer remains over the top surface of first gate 446 at this step and first conductor layer 414 of first gate 446 is exposed. Over second region 444, the removal of top oxide layer 428 and nitride layer 426 exposes the hardmask layer 416 with its first layer 418 and second layer 420.

At this point in the process, the split gate device has been formed, with a first gate 446 (provided by first conductor layer 414) and a second gate 430 (provided by second conductor layer formation 430), and with a dielectric provided by bottom oxide layer 424, nitride layer 426, and top oxide layer 428 to separate the inner facing sidewalls of the first and second gates. However, the periphery device has not yet been formed, with only the second hardmask gate pattern having been formed over second region 444 and first conductor layer 414 still unpatterned.

Figure 4I:
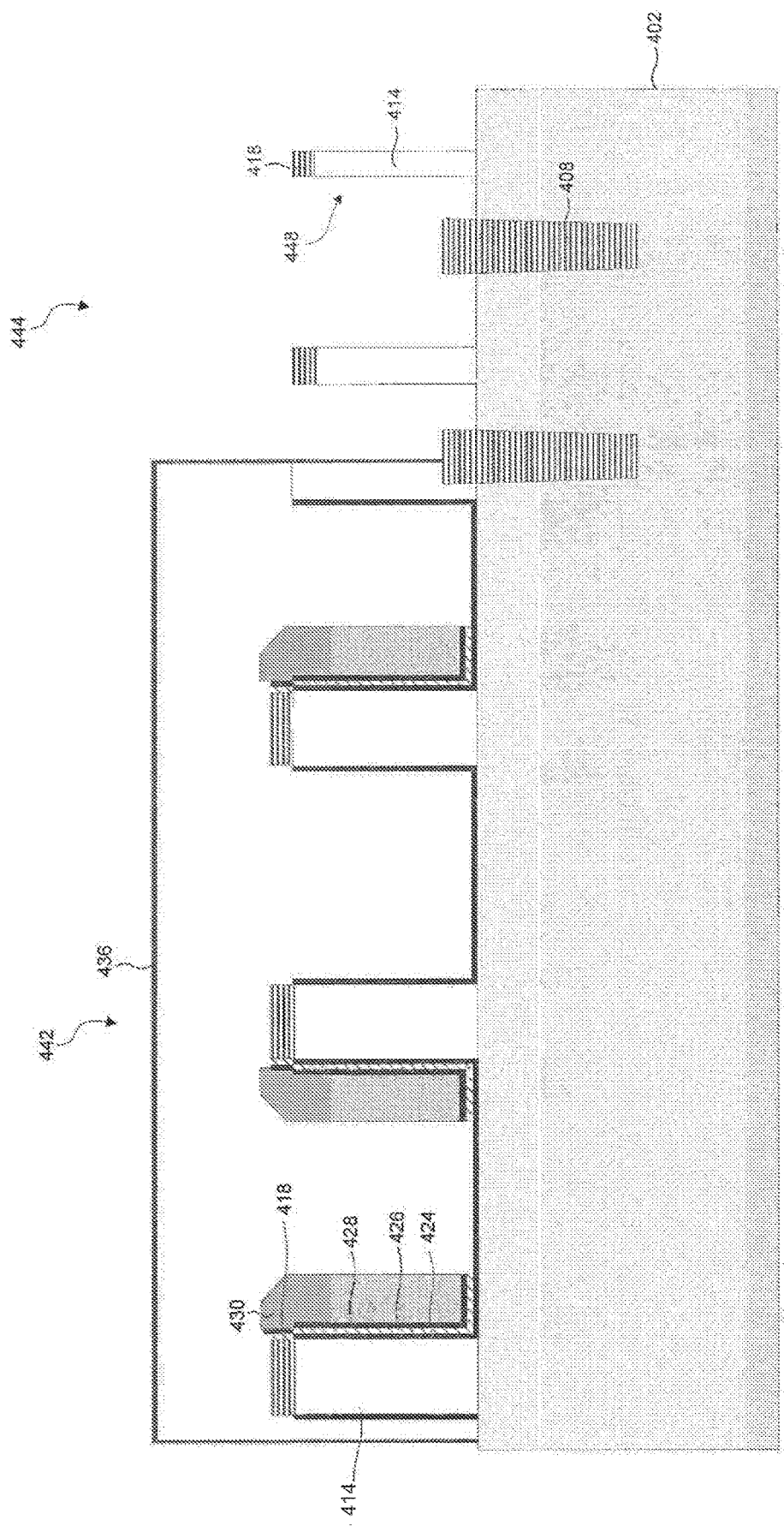

Then, as illustrated in FIG. 4I, a photo resist mask 436 is formed to cover first region 442. In an embodiment, photo resist mask 436 extends slightly onto second region 444 as shown in FIG. 4I. First conductor layer 414 is then etched according to the second hardmask gate pattern over second region 444 to form periphery device gates 448. It is noted that no photo resist mask over second region 444 is needed to perform the etching of first conductor layer 414 because the second hardmask gate pattern provides a mask equivalent in this case. As a result, however, some of hardmask layer 416 is eroded in second region 444. For example, as shown in FIG. 4I, second layer 420 of hardmask layer 416 may be completely eliminated and only some of first layer 418 of hardmask layer 416 may remain after the etching of first conductor layer 414 over periphery device gates 448.

Figure 4J:
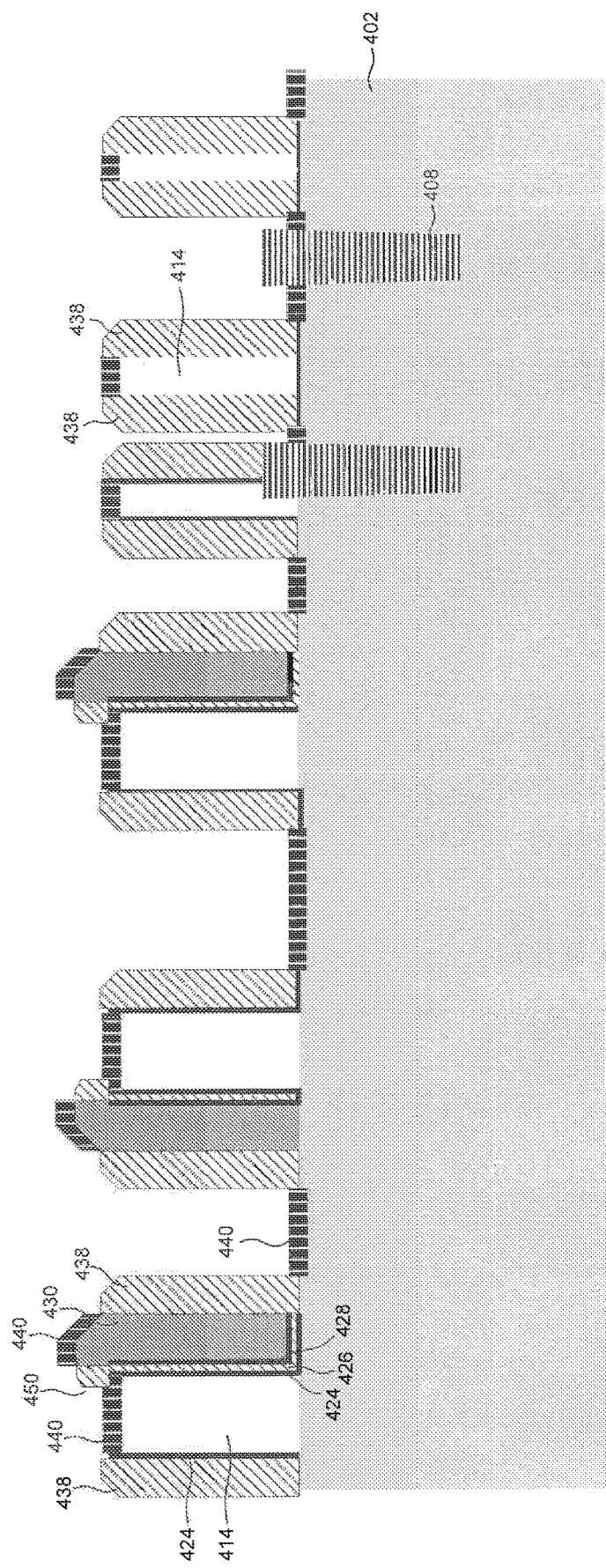

Then, as illustrated in FIG. 4J, photo resist mask 436 is stripped and a wet clean is performed, before a spacer layer is formed (e.g., disposed) over the entire substrate 402. The spacer layer may include an oxide layer and/or a nitride layer. The spacer layer is then etched (e.g., anisotropically dry etched) to form first and second spacers 438 on respective sidewalls of the split gate device. A third spacer 450 is also formed over first gate 446 by the etching of the spacer layer. Third spacer 450 covers a portion of the inner sidewall of second gate 430 that extends above the top surface of the first gate.

Finally, a silicide layer 440 is formed. In an embodiment, silicide layer 440 is formed by depositing a metal over the entire substrate 402 and then exposing the wafer to temperatures that promote a chemical reaction between the metal and any exposed silicon to form a silicide. Silicide layer 440 thus forms on top of first gate 446, second gate 430, and over exposed regions of substrate 402 as shown in FIG. 4J. In an embodiment, silicide layer 440 is configured to lower the resistance of first gate 446 and second gate 430, making them faster to read, write, or erase.

As described above, the FIGS. 4A-J represent only exemplary steps of an integrated method for fabricating a split gate device and a periphery device according to an embodiment. These exemplary steps are provided for the purpose of illustration and are not limiting of embodiments. As would be understood by a person of skill in the art based on the teachings herein, a method according to embodiments may include fewer or more steps than described above and any of the steps described above can be performed in a variety of other ways as would be apparent to a person of skill in the art.

FIG. 5 is a cross sectional view of an example split gate device 500 according to an embodiment. Example split gate device 500 is provided for the purpose of illustration and is not limiting of embodiments. Example split gate device 500 can be realized using the process described above in FIGS. 4A-4J, whereby a periphery device is also formed together with example split gate device 500. Alternatively, example split gate device 500 can be realized using a process that results in a standalone split gate device.

As shown in FIG. 5, example split gate device 500 is formed over a substrate 502 having first and second doped regions 524 and 526. Split gate device 500 includes a first gate 504 (e.g., select gate); a second gate 506 (e.g., memory gate); and a dielectric (made of three layers 508, 510, and 512) having a first portion disposed between second gate 506 and substrate 502 and a second portion disposed along an inner sidewall of first gate 504 to separate select gate 504 from memory gate 506.

In an embodiment, first gate 504 and second gate 506 are made from first and second poly materials, which may or may not be the same. The dielectric may include one or more dielectric layers. For example, the dielectric may be of the ONO type, which includes a silicon nitride layer sandwiched between two silicon dioxide layers. In an embodiment, the silicon nitride layer is used as a charge trapping layer resulting in split gate device 500 being a charge trapping split gate device. Other charge trapping dielectric may also be used including a silicon-rich nitride film, or any film that includes, but is not limited to, silicon, oxygen, and nitrogen in various stoichiometries.

Split gate device 500 also includes first and second silicide layers 516 and 514 disposed over first gate 504 and second gate 506 respectively; first and second spacers 520 and 518 disposed along the outer sidewalls of first gate 504 and second gate 506 respectively; and a third spacer 522 formed over first gate 504 along the inner sidewall of second gate 506. Third spacer 522 covers a portion of the inner sidewall of second gate 506 that extends above a top surface of first gate 504. According to embodiments, third spacer 522 can be formed due to the fact that second gate 506 is greater in height than first gate 504 and that first gate 504 has a flat surface (rather a sloped surface like second gate 506). Third spacer 522 prevents silicide layers 514 and 516 from coming in contact with each other when formed (which can result in first gate 504 and second gate 506 forming a short-circuit).

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A split gate device, comprising:
   a select gate disposed over a substrate;
   a memory gate disposed over the substrate;
   a dielectric structure having a first portion disposed between the memory gate and the substrate and a second portion disposed along an inner sidewall of the select gate to separate the select gate from the memory gate;
   first and second silicide layers disposed over the select gate and the memory gate respectively; and
   a spacer formed over the select gate along an inner sidewall of the memory gate, the spacer covering a portion of the inner sidewall of the memory gate that extends above a top surface of the select gate, wherein the spacer is disposed directly above a top surface of the second portion of the dielectric structure, and wherein the spacer is disposed above the top surface of the select gate partially such that at least a portion of the top surface of the select gate is not covered by the spacer.

2. The split gate device of claim 1, wherein a height of the memory gate is greater than a height of the select gate.

3. The split gate device of claim 1, wherein a top surface of the memory gate has a greater elevation than the top surface of the select gate.

4. The split gate device of claim 1, wherein the dielectric structure further comprises an oxide-nitride-oxide configuration.

5. The split gate device of claim 1, wherein the spacer insulates the first silicide layer from the memory gate.

6. The split gate device of claim 1, further comprising an outer spacer disposed respectively adjacent to an outer sidewall of the select gate and memory gate.

7. A device, including:
   a substrate divided into a core region and a periphery region,
   wherein the core region comprises at least one memory device formed on the substrate, each memory device including,
      a select gate disposed adjacent to a memory gate over the substrate,
      a dielectric structure having a first portion disposed underneath the memory gate and a second portion disposed between and separating the select gate from the memory gate,
      a spacer formed over the select gate, insulating the memory gate and select gate from one another, wherein the spacer is disposed directly above a top surface of the second portion of the dielectric structure, and wherein the spacer is disposed above the top surface of the select gate partially such that at least a portion of the top surface of the select gate is not covered by the spacer, and
   wherein the periphery region comprises at least one first type of transistor and at least one second type of transistor formed on the substrate, wherein a first gate dielectric of the at least one first type of transistor is thicker than a second gate dielectric of the at least one second type of transistor.

8. The device of claim 7, wherein the at least one first type of transistor is a high voltage (HV) transistor and the at least one second type of transistor is a low voltage (LV) transistor.

9. The device of claim 8, wherein the HV transistor comprises a HV gate and the LV transistor comprises a LV gate, and wherein a top surface of the HV gate has an approximately same elevation of a top surface of the LV gate.

10. The device of claim 9, wherein the top surfaces of the HV and LV gates have the approximately same elevation of a top surface of the select gate.

11. The device of claim 7, wherein a top surface of the memory gate has a greater elevation than a top surface of the select gate.

12. The device of claim 7, wherein the spacer is formed covering a portion of an inner sidewall of the memory gate that extends above a top surface of the select gate.

13. The device of claim 7, wherein the dielectric structure comprises a charge-trapping nitride layer disposed between two oxide layers.

14. The device of claim 7, wherein the dielectric structure has an L-shape, the first portion being substantially vertical, and the second portion being substantially horizontal, and wherein the first and second portions are formed integrally.

15. The device of claim 7, wherein each of the memory devices further comprises:
   first and second silicide layers disposed overlying the select gate and the memory gate respectively.

16. A system-on-chip (SOC) device, comprising:
   a memory array including a plurality of memory cells, wherein each memory cell includes,
      a select gate disposed adjacent to a memory gate and over a substrate, wherein a top surface of the memory gate has a greater elevation than a top surface of the select gate, a dielectric structure having a first portion disposed underneath the memory gate and a second portion disposed between and separating the select gate from the memory gate, a spacer formed over the select gate, insulating the memory gate and select gate from one another, wherein the spacer is disposed directly above a top surface of the second portion of the dielectric structure, and wherein the spacer is disposed above the top surface of the select gate partially such that at least a portion of the top surface of the select gate is not covered by the spacer; and a peripheral circuitry comprising, a plurality of first transistors, each first transistor including a first gate dielectric disposed underneath a first gate, and a plurality of second transistors, each second transistor including a second gate dielectric disposed underneath a second gate, wherein the first gate dielectric has a greater thickness than the second gate dielectric, and wherein top surfaces of the first and second gates have an approximately same elevation.

17. The SOC device of claim 16, wherein the memory array and the peripheral circuitry are embedded in a single substrate.

18. The SOC device of claim 16, wherein the memory cell further comprises first and second silicide layers disposed over the select gate and the memory gate respectively.

19. The SOC device of claim 16, wherein the select gate of the memory cell, the first gate of the first transistor, and the second gate of the second transistor are formed concurrently with a same material such that top surfaces of the select, first, and second gates have the approximately same elevation.

20. The split gate device of claim 1, wherein the spacer is formed over a portion of the first silicide layer.

* * * * *